United States Patent [19]

Denison

[11] Patent Number: 4,862,081
[45] Date of Patent: Aug. 29, 1989

[54] DC ARTIFACT REMOVAL IN MAGNETIC RESONANCE IMAGING

[75] Inventor: Kenneth S. Denison, Shaker Hts., Ohio

[73] Assignee: Picker International, Inc., Highland Heights, Ohio

[21] Appl. No.: 275,392

[22] Filed: Nov. 23, 1988

[51] Int. Cl.$^4$ ............................................. G01R 33/20
[52] U.S. Cl. .................................... 324/307; 324/322
[58] Field of Search ............... 324/300, 307, 309, 312, 324/313, 314, 318, 322, 77 R, 77 D, 78 D, 79 D, 83 D

[56] References Cited

U.S. PATENT DOCUMENTS

| | | | |
|---|---|---|---|
| 4,604,580 | 8/1986 | Sugiura | 324/311 |
| 4,612,504 | 9/1986 | Pelc | 324/309 |
| 4,616,133 | 10/1986 | Glover et al. | 324/309 |
| 4,616,182 | 10/1986 | Kramer | 324/309 |
| 4,694,250 | 9/1987 | Iwaoka | 324/309 |
| 4,766,400 | 8/1988 | Fox | 324/309 |

*Primary Examiner*—Michael J. Tokar
*Attorney, Agent, or Firm*—Fay, Sharpe, Beall, Fagan, Minnich & McKee

[57] ABSTRACT

In the absence of signals supplied to gradient field coils (14), radio frequency signals, or magnetic resonance signals received by coil (18), analog-to-digital converters (44, 46) indicate background noise and DC offset. An attenuator (26) attenuates signals from the receiving coil in the absence of magnetic resonance signals. A phase sensitive detector (38) produces real and imaginary signal components both in the absence of magnetic resonance signals during calibration and subsequently during the processing of magnetic resonance signals. The analog-to-digital converters, low pass filters (40, 42), and the phase sensitive detectors inject an undesirable DC offset into the signals. In the absence of a magnetic resonance signal, the digitized output of the analog-to-digital converters is substantially the DC offset plus noise. A statistical analysis routine (64) analyzes the sampled analog-to-digital data in the absence of a magnetic resonance signal. Based on the variation among the samples, the desired level of confidence and accuracy, the statistical analysis means determines how many samples must be averaged to determine the DC noise with the desired confidence. An averaging circuit (66) averages at least the selected number of samplings. DC correction circuits (50, 52) subtract the determined DC offset values for the real and imaginary channels from the real and imaginary magnetic resonance signals in subsequent scans before the magnetic resonance data is reconstructed (54) into an image representations.

15 Claims, 2 Drawing Sheets

DC ARTIFACT REMOVAL IN MAGNETIC RESONANCE IMAGING

BACKGROUND OF THE INVENTION

The present invention relates to the magnetic resonance arts. It finds particular application in conjunction with the removal of DC artifacts from two and three dimensional magnetic resonance images.

Heretofore, an analog magnetic resonance signal was digitized by an analog-to-digital converter. The digitized data was Fourier transformed and subject to other data processing to generate a resultant image. Commonly, the digitized data was the sum of the magnetic resonance signal and a DC offset. When the DC offset was Fourier transformed and processed, it commonly manifested itself as a bright point or spot in the resultant image. Some processing techniques such as zero filling prior to performing the Fourier transform tended to smear the bright spot. Various techniques have been developed to reduce the deleterious effects of DC artifacts.

In one technique illustrated in U.S. Pat. No. 4,612,504, the DC artifact was shifted to the edge of the resultant image. More specifically, the phase of the RF excitation pulse was altered by 180 between sequential phase encoding views. The DC offset is independent of the RF phase change and has a limited bandwidth. Accordingly, the artifact was reduced to small regions at the edge of the field of view and did not interfere with the central region of the image. A primary disadvantage of this technique was that the artifact was not removed, only relocated. When the object of interest was not in the center of the field of view, the DC artifact may lie on part of the object.

In another technique, each view was collected twice in first and second almost identical magnetic resonance excitations. However, the RF pulse in one was 180° out of phase relative to the other. The two common views were then subtracted such that the magnetic resonance component sums and the DC component subtracts. Although this technique successfully removed the DC artifact, it required a doubling of the imaging sequence.

In yet another technique, the DC offset in each view was estimated based on a small number of points at the very beginning and end of the data sampling. It was assumed that at the ends of the sampling period there was no magnetic resonance signal - just noise and DC offset. A small number of the first and last sampled points for both the real and imaginary channels of each view were sampled. The average of these points was assumed to be the DC offset and subtracted from each point in the corresponding view. A primary drawback to this technique was that it did not calculate the DC offset accurately and consistently. Whether the end points of the sample contained magnetic resonance signals and how much varied from view to view, with the imaged object, with scan parameters, and the like. Thus, some views were corrected relatively accurately, while other views had a grossly exaggerated DC offset subtracted. Commonly, this produced a DC artifact in the form of a line down the center of the image.

To eliminate the magnetic resonance component when sampling the DC offset, U.S. Pat. No. 4,616,183, performed a data acquisition with no RF pulse. Either prior to or after the image data acquisition, or both, a similar data acquisition was made using similar or identical scan parameters. This additional data acquisition could be done for each slice, for each echo, or for each transmit/receive RF pulse. The data sampled in the absence of the RF pulse was sampled and averaged to generate real channel and imaginary channel DC offsets for each slice, echo, and transmit/receive pulse. During the reconstruction process, the appropriate DC offset value was subtracted from each view of data. However, this technique failed to produce artifact free images. Although the DC offset compensation sampling was free of magnetic resonance signals, the level of noise was relatively high. In a normal sampling interval, there were not enough samples available to average out and accurately estimate the DC offset. Due to fluctuations in the noise from view to view, the views were corrected with varying degrees of accuracy. Moreover, for scans with long repeat times and a large number of slices and echoes, this technique significantly lengthened the imaging time.

The DC offset artifact has also been removed subsequent to reconstructing the image representation. When the image was reconstructed without filtering and without interpolation, i.e. without a zero filled transformation or post transformation interpolation, the DC artifact was a single pixel of very high intensity. The DC artifact pixel value was zeroed and replaced with the average of its neighbors. One of the drawbacks of this technique was that although the artifact was removed, it was not corrected. Further, when filtering or using zero filled transformations, the artifact was spread out in either the phase encoding direction, the frequency encoding direction, or both, over several pixels, particularly in three dimensional scans. Replacing a plurality or line of pixels with the average of adjoining pixel values could create a different but perceptible artifact.

The present invention contemplates a new and improved technique which accurately removes DC artifacts.

SUMMARY OF THE INVENTION

The present invention recognizes that the DC offset remains relatively constant over long durations. Once the DC offset is determined, it can be used for an entire scan or many scans.

In accordance with one aspect of the present invention, a method of DC offset correction is provided. A phase sensitive detector, an analog-to-digital converter, and other components of a magnetic resonance imager are brought up to their normal operating state. The analog-to-digital converter repeatedly samples and produces a digital output signal in the absence of magnetic resonance. An amount of DC error that can be tolerated in the resultant image is determined. The digitized data is statistically analyzed to determine whether enough samples have been collected to predict the DC offset within the determined DC error tolerance.

More specifically, the statistical analysis includes determining variation among the digital data, mean values of the digital data, and determining the number of digital data samplings that will be necessary to predict the DC offset within the determined error. At least that number of samples is collected, averaged, and a DC offset determined. During subsequent magnetic resonance imaging scans, the determined DC offset is subtracted from each digital magnetic resonance value.

In accordance with a more limited aspect of the present invention, the signal received by the phase sensitive detector is attenuated. Because the signal received by the phase sensitive detector is primarily noise and because DC offset is primarily introduced by the components from the phase sensitive detector through the analog-to-digital converter, attenuating the signal into the phase sensitive detector tends to eliminate noise and data variations. The reduction in the noise variations among the sampled digital data values reduces the number of samples required to bring the DC error within the determined tolerances.

In accordance with another aspect of the present invention, a magnetic resonance imaging apparatus is provided. The imaging apparatus includes conventional hardware for causing a main magnetic field through the subject, gradient magnetic fields across the main magnetic field, radio frequency magnetic resonance excitation and manipulation pulses, and an antenna for receiving magnetic resonance signals. The antenna is connected to a receiver which in turn is connected with a phase sensitive detector. Real and imaginary component outputs of the phase sensitive detector are connected with first and second analog-to-digital converters. Image reconstruction circuitry is connected with the analog-to-digital converters. Further, a sampling means for receiving the output of the analog-to-digital converters in the absence of a magnetic resonance signal are provided. A statistical analysis means determines the number of samplings necessary to bring the accuracy of a DC offset measurement within preselected tolerances. The sampling means samples the output of the analog-to-digital converter the number of times determined by the statistical analysis means. An averaging means averages the sampled analog-to-digital values for each of the real and imaginary components. A combining means combines the determined real and imaginary average DC values With the real and imaginary components, respectively, of magnetic resonance data.

A primary advantage of the present invention is that it enables DC artifacts to be eliminated.

Another advantage is that the DC artifacts are eliminated without increasing scan times.

Another advantage of the present invention is that it accurately estimates and corrects for DC components.

Still further advantages of the present invention will become apparent to those of ordinary skill in the art upon reading and understanding the following detailed description.

BRIEF DESCRIPTION OF THE DRAWINGS

The invention may take form in various steps and arrangements of steps or in various components and arrangements of components. The drawings are only for purposes of illustrating a preferred embodiment and are not to be construed as limiting the invention.

The FIGS. 1A and 1B are a diagrammatic illustration of a magnetic resonance imaging apparatus in accordance with the present invention.

DETAILED DESCRIPTION OF THE PREFERRED EMBODIMENT

Figure 1A:
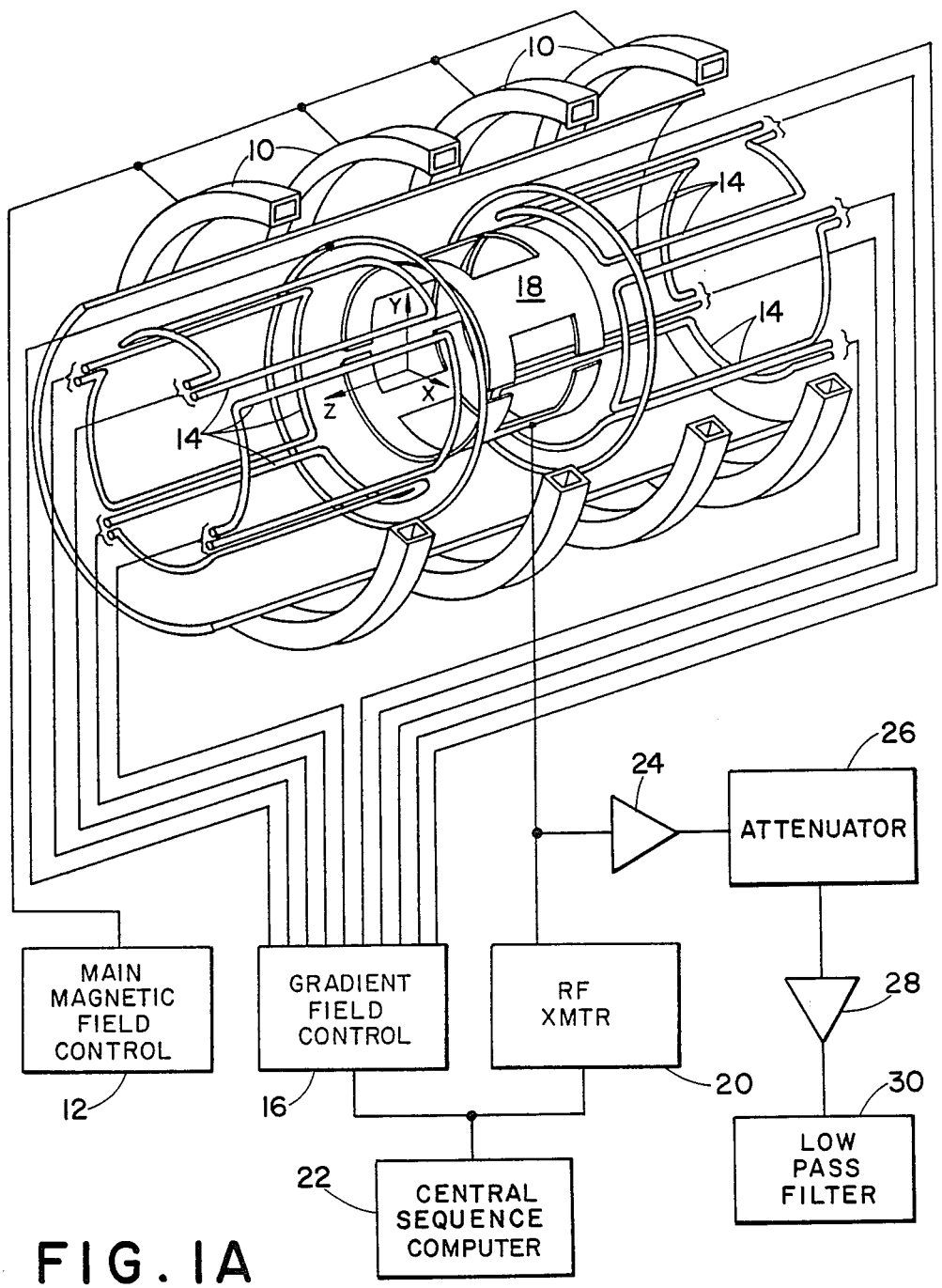
Figure 1B:
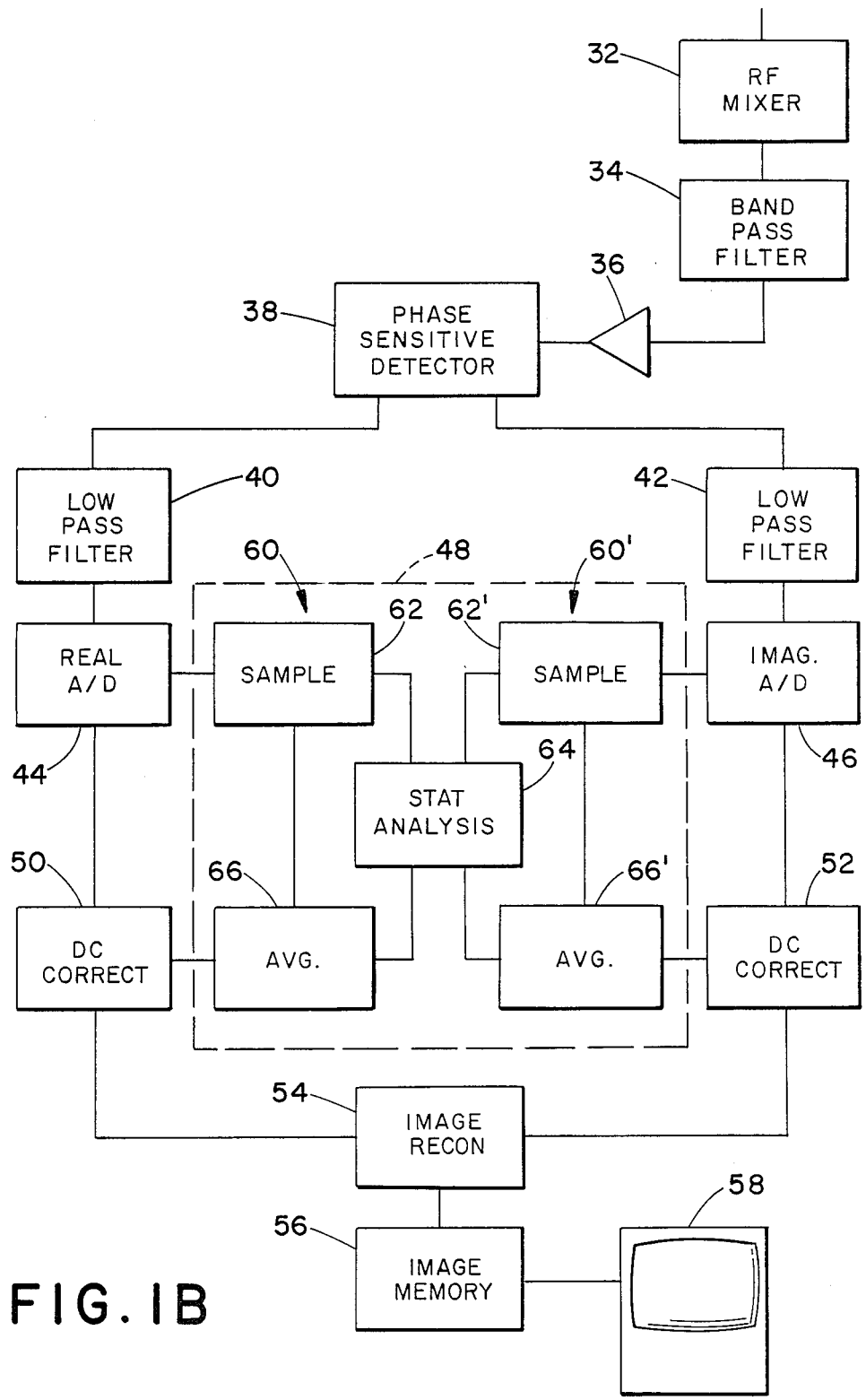

With reference to the FIGS. 1A and 1B, a main magnetic field means including resistive or superconducting magnets 10 and a main magnetic field controller 12 which generate a substantially uniform main magnetic field through an image region. With superconducting magnets, the controller 12 is used only to ramp the field up or down. Gradient field coils 14 convert electrical pulses from a gradient field control means 16 into magnetic field gradients across the main magnetic field. By selectively applying current pulses to appropriate ones of the gradient coils, appropriate imaging gradients along mutually orthogonal axes are generated. For example, slice select, phase encode, and read gradients may be selectively applied.

Radio frequency pulses are transmitted into the examination region by radio frequency transmit/receive coils 18. An RF pulse generator or transmitter 20 formats each RF pulse with a selected shape and magnitude. The RF pulses selectively excite magnetic resonance and cause the magnetization of resonating dipoles to be tipped with selected angles, generally between zero and 180°. A sequence controller 22 controls the gradient field control means 16 and the RF pulse generator 20 to produce selected imaging or other magnetic resonance sequences.

Magnetic resonance signals from the resonating dipoles in the image region impinge upon the coil or an antenna 18 and are conveyed to a preamplifier 24 which amplifies the received magnetic resonance signal. Optionally, a dedicated receiving coil can be provided, such as a surface coil arrangement separate and distinct from the coil 18. An attenuator 26 selectively reduces or attenuates magnetic resonance signals. An amplifier 28 amplifies the analog magnetic resonance signal which is filtered by a low pass filter 30. An RF mixer 32 demodulates the received magnetic resonance signal which is then filtered by a band pass filter 34. When the RF mixer demodulates the magnetic resonance signal, any DC components become high frequency components which are filtered by the band pass filter 34. The filtered analog magnetic resonance signal is amplified by amplifier 36 and conveyed to a phase sensitive detector 38.

The phase sensitive detector demodulates the magnetic resonance signals and produces real and imaginary analog output components which are 90° out of phase, i.e. quadrature detected. The phase sensitive detector demodulates the magnetic resonance signal which again causes the DC components added by the RF mixer, amplifier, and band pass filter to appear as a high frequency. Low pass filters 40 and 42 remove the high frequency or DC component such that any DC offset added by the circuitry prior to the phase sensitive detector is eliminated. First and second analog-to-digital converters 44, 46 convert the analog real and imaginary components to digital components.

Because the phase sensitive detector 38 and low pass filters 40, 42 remove any DC bias from the signal received by the phase sensitive detector and because DC offsets are not accidentally or incidentally added to digital signals, the artifact causing objectionable DC offset is attributable to the phase sensitive detector 38, the low pass filters 40, 42, the analog-to-digital converters 46, and any intervening circuitry. The phase sensitive detector, analog-to-digital converters, and other intervening circuitry are configured with components that have a relatively high stability such that the injected DC offset does not vary appreciably during a relatively long time period, e.g. 24 hours. Accordingly, the DC offset does not vary during the scan or even a series of scans. Thus, a single accurate measure of the DC offset for the real and imaginary channels can correct all views of a scan or family of scans. The accuracy and effectiveness of the correction is determined by the accuracy of this measurement.

A DC offset determining means 48 accurately determines the DC offset for both the real and imaginary channels. Combining means 50, 52 selectively remove the determined DC offset from the real and imaginary digital signals. Alternately, the DC offset might be removed by subtracting the determined DC offset prior to the analog-to-digital conversion.

An image reconstruction means 54 reconstructs an image representation from the real and imaginary magnetic resonance signal components. The image representation may be stored in an image memory 56 for display on a video monitor 58. Optionally, the image representation may be subject to further processing, stored on tape or disk, or the like.

Because the DC offset is injected by the components from the attenuator through the analog-to-digital converter, it is unnecessary to transmit either radio frequency pulses into the image region or pulse the magnetic field gradients while measuring the DC offset. Rather, if the system were free of noise, a constant value equal to the DC offset would be read from each analog-to-digital converter. However, this data is not noise-free.

The noise is primarily contributed by two sources. First, thermal noise is contributed by a load on the input to the preamplifier 24, i.e. thermal noise from the receiving coils. Second, the analog-to-digital converters contribute significant quantization noise. The other electronic devices and components have smaller impact on the noise.

The noise is random, uncorrelated noise, which is distributed according to a Gaussian or standard normal distribution. Thus, the DC offset is overlaid with significant random noise. The measurement of DC offset thus, is a problem of estimating the mean of a set of randomly chosen samples. This is a classical problem in statistics with a well known solution. The n randomly chosen samples are distributed according to the Student t distribution with n−1 degrees of freedom. The accuracy to which the sample mean, i.e. the measured DC, approximates the population, i.e. the true DC is determined by using tables of the t statistic.

$$t = (x - u) \div (s/\sqrt{n}), \quad (1)$$

where x is the sample mean, u is the population mean, s is the sample's standard deviation, and n is the number of samples. The value of t is tabulated at varying levels of confidence and for varying degrees of freedom. For example, with n=1000, there is a 99% probability that t will be between −2.576 and +2.576. If the standard deviation is 10, (x−u) is expected to be between −0.81 and +0.81. Thus, there would be a 99% probability that the error of the estimation of the DC offset is between −0.81 and +0.81, a relatively high error.

The accuracy of the estimate of the DC offset is inversely proportional to the sample standard deviation and is directly proportional to the square root of the number of samples. Thus, decreasing the standard deviation of the samples and increasing the number of samples each increase the accuracy of the estimate. Alternately stated, decreasing the standard deviation decreases the number of samples required to obtain a preselected level of accuracy.

The DC offset determining means 48 includes a real channel, offset determining means 60 and an imaginary channel, offset determining means 60, respectively. A sampling means 62 samples the data multiple times, generally on the order of several thousand times. A statistical analysis means 64 analyzes the sampled data. The statistical analysis means determines how many samplings of the data must be averaged for the average to be within a preselected tolerance of the true DC offset. Typically, well over a thousand samples must be acquired for a high accuracy of offset measurement. An averaging means 66 averages the sampled data to determine a DC offset value. The combining means 50, 52 subtract the corresponding real channel and imaginary channel averages from magnetic resonance data during magnetic resonance scans.

The statistical analysis means 64 determines the sample mean, the population mean, the standard deviation, and the number of samples. From Equation (1) above, the value of t is determined. In standard statistic tables, the value of t is tabulated for varying levels of confidence and for varying degrees of freedom (n−1). For a given accuracy or level of confidence, a value of t is determined and Equation (1) is solved for the corresponding number of samples. The statistics means 64 then causes the sampling means 62 to sample the determined number of samples for averaging.

Looking to the details of the preferred statistical analysis, the statistical analysis is conducted in the absence of radio frequency pulses, magnetic field gradients, and magnetic resonance signals. Because substantially all of the DC offset is injected by the phase sensitive detector, low pass filter, and analog-to-digital converters, the DC offset could even be determined with only these components turned on or active. In order to minimize system noise which minimizes the variation or distribution of the samples, the attenuator 26 is set to its maximum value, e.g. 31 decibels. This minimizes the input signal, hence, the input noise from the antenna coil and reduces the thermal noise gain. Alternately, the input to the receiver could be blanked by switching it from the receiving coil to a terminator which could provide as much as 90 decibels of attenuation.

The sampling means 62 samples the output of the analog-to-digital converters 44, 46 with the receiver phase at the zero degrees. The sampled real and imaginary channel values are averaged by the averaging means to determine the offsets. The number of samples needed to estimate the offset with the desired level of accuracy and confidence is determined using the Student t distribution.

By way of example, assume that one desires to have a 99% confidence that the DC offset is estimated to within 0.1. If the standard deviation among the samples is 5.0, then the Student t tables indicates that 16,000 samples must be acquired and averaged. To illustrate the value of attenuating the input data, each decibel of attenuation reduces the voltage of the noise by a factor of the sixth root of two. The standard deviation is reduced by the same factor. Thus, for 31 decibels of attenuation, the standard deviation is reduced by $2e^{31/6}$. In this example, if the attenuator produced 0 decibels of attenuation rather than 31 decibels, then it would be necessary to collect 20,643,942 samples to obtain the same degree of accuracy.

The invention has been described with reference to the preferred embodiment. Obviously, modifications and alterations will occur to others upon reading and understanding the preceding detailed description. It is intended that the invention include all such alterations and modifications insofar as they come within the scope of the appended claims or the equivalents thereof.

Having thus described the preferred embodiment, the invention is now claimed to be:

1. A method of determining a DC offset correction for magnetic resonance imaging, the method comprising:

in the absence of radio frequency, magnetic resonance and magnetic field gradient signals, sampling an output of an analog-to-digital converter for digitizing magnetic resonance signals;

statistically analyzing variations in the sampled outputs to determine a number of samples that are statistically required to be averaged to determine a DC offset value within a preselected tolerance;

repeating the sampling of at least the selected number of times; and, averaging the sampled outputs to determine a DC offset value.

2. The method as set forth in claim 1 further including attenuating an input from a magnetic resonance receiving coil which is operatively connected with the analog-to-digital converter in order to reduce noise, which reduction in noise reduces variation among the sampled outputs.

3. The method as set forth in claim 2 further including after determining the DC offset value:

generating magnetic resonance data which is phase sensitively detected, digitized, and used to reconstruct a magnetic resonance image representation; and, further including subtracting the DC offset value from the digitized data.

4. The method as set forth in claim 2 further including phase sensitively detecting any signal received from the attenuator, the phase sensitive detecting step producing real and imaginary analog components;

low pass filtering the real and imaginary components; and, wherein the analog-to-digital converting step includes separately digitizing the low pass filtered real and imaginary components.

5. The method as set forth in claim 2 further including after determining real and imaginary DC offset values, generating magnetic resonance data which is received and processed by the same components used to perform the phase sensitive detection and analog-to-digital conversion steps such that real and imaginary magnetic resonance data components are generated for reconstruction into an image representation; and, subtracting the determined real and imaginary DC offset values from the real and imaginary magnetic resonance signal components.

6. The method as set forth in claim 1 wherein the statistical analyzing step includes:

determining a level of confidence with which the DC offset value is to be determined;

determining variations among the sampled data;

from the variations and preselected confidence, determining a number of sampling to be performed.

7. The method as set forth in claim 6 wherein the step of determining the variation includes determining a sample mean, a population mean, and a sample standard deviation.

8. The method as set forth in claim 7 wherein the step of determining the confidence includes determining a t-statistic of a Student t distribution corresponding to the selected level of confidence and wherein the step of determining the number of samples includes calculating a square of a difference between the sample and population mean divided by a square of a product of the sample standard deviation and the t-statistic.

9. A method of magnetic resonance imaging comprising:

in the absence of magnetic resonance and radio frequency signals, phase sensitive detecting an output of a magnetic resonance receiving coil to produce real and imaginary components;

filtering the real and imaginary signal components;

digitizing the real and imaginary signal components;

sampling each of the real and imaginary digital components a plurality of times;

statistically analyzing the digital real and imaginary component samples to determine a number of samples, which when averaged predict a DC offset within a preselected tolerance with a preselected level of confidence;

averaging the determined number of real and imaginary samples to produce a real DC offset value and an imaginary DC offset value;

inducing magnetic resonance and receiving magnetic resonance signals with the magnetic resonance receiving coil;

phase sensitive detecting the received magnetic resonance signals to generate real and imaginary magnetic resonance components, filtering the real and imaginary magnetic resonance signal components; digitizing the filtered real and imaginary magnetic resonance signal components;

subtracting the real and imaginary DC offset values from the real and imaginary magnetic resonance signal components and DC offset values; and, reconstructing the difference between the digitized magnetic resonance signal components into an image representation.

10. The method as set forth in claim 9 further including attenuating the output of the magnetic resonance receiving coil in the absence of magnetic resonance signals.

11. A magnetic resonance apparatus comprising:

a means for generating a main magnetic field through an image region;

a gradient field means for causing gradient magnetic fields across the main magnetic field;

a radio frequency means for exciting add manipulating magnetic resonance of dipoles of an object in the image region;

a receiving coil for receiving magnetic resonance signals from the resonating dipoles in the image region;

a phase sensitive detector operatively connected with the receiving coil, the phase sensitive detector having real and imaginary output channels;

a first filter connected with the phase sensitive detector real channel output and a second filter connected with the imaginary channel output;

a first analog-to-digital converter connected with the first filter and a second analog-to-digital converter connected with the second filter;

a sampling means for sampling the output of each of the analog-to-digital converters a plurality of times;

a statistical analysis means for analyzing the plurality of real and imaginary converter output samples to determine a number of samples needed to predict a DC offset value within preselected accuracy with a preselected level of confidence;

an averaging means for averaging the converter output samples, the averaging means being operatively connected with the statistical analysis means and the first and second analog-to-digital converters for averaging at least the determined number of converter outputs samples to produce a real DC offset value and an imaginary DC offset value;

DC offset correction means operatively connected with the first and second analog-to-digital converters for combining the determined real and imaginary DC values with subsequent digital magnetic resonance signal components; and, an image reconstruction means for reconstructing an image representation from the DC corrected subsequent digital magnetic resonance signal components.

12. The apparatus as set forth in claim 11 further including an attenuator connected between the receiving coil and the phase sensitive detector.

13. The apparatus as set forth in claim 12 further including amplifier means and frequency filter means connected between the receiving coil and the phase sensitive detector.

14. The apparatus as set forth in claim 11 wherein the DC offset correction means includes two digital subtraction means, one for subtracting the real DC offset value from digitized real magnetic resonance signal components and the other for subtracting the imaginary DC offset value from subsequent digitized imaginary magnetic resonance signal components.

15. The apparatus as set forth in claim 14 further including a display means for displaying the reconstructed magnetic resonance image representation.

* * * * *